US008896386B2

(12) United States Patent
Lee et al.

(10) Patent No.: US 8,896,386 B2
(45) Date of Patent: Nov. 25, 2014

(54) CALIBRATION DEVICE FOR OSCILLATOR AND METHOD THEREOF (71) Applicant: MediaTek Singapore Pte. Ltd., Singapore (SG)

(72) Inventors: Wen-Chang Lee, Taipei (TW); Ping-Ying Wang, Hsinchu (TW)

(73) Assignee: MediaTek Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/786,469

(22) Filed: Mar. 6, 2013

(65) Prior Publication Data

US 2013/0234800 A1    Sep. 12, 2013

Related U.S. Application Data (60) Provisional application No. 61/608,498, filed on Mar. 8, 2012.

(51) Int. Cl.
  H03L 7/00    (2006.01)
  H03L 7/06    (2006.01)
  H03L 7/087   (2006.01)
  H03L 7/10    (2006.01)
  H03L 7/197   (2006.01)
  H03L 7/18    (2006.01)

(52) U.S. Cl.
  CPC ... H03L 7/06 (2013.01); H03L 7/18 (2013.01); H03L 7/087 (2013.01); H03L 7/10 (2013.01); H03L 7/1976 (2013.01)

USPC ............. 331/34; 331/1 A; 331/25; 331/18; 327/156; 327/159

(58) Field of Classification Search
  USPC ............. 331/1 A, 34, 25, 18; 327/156, 159
  See application file for complete search history.

(56) References Cited

U.S. PATENT DOCUMENTS

| 7,750,696 B2 * | 7/2010 | Wang et al. ............. 327/156 |
| 8,750,448 B2 * | 6/2014 | Mazkou et al. ........... 375/376 |
| 2004/0146132 A1 * | 7/2004 | Staszewski et al. ....... 375/376 |
| 2010/0264993 A1 | 10/2010 | Wang et al. |

* cited by examiner

Primary Examiner — Arnold Kinkead
(74) Attorney, Agent, or Firm — Winston Hsu; Scott Margo (57) ABSTRACT A calibration device arranged for calibrating an oscillating frequency of an oscillator includes: a phase locking device arranged to track a first reference clock generated by the oscillator until a feedback clock is phase-aligned with the first reference clock, and then arranged to track a second reference clock generated by the oscillator until a phase difference between the second reference clock and the feedback clock is a static phase difference, wherein the feedback clock is generated by dividing an output oscillating signal of the phase locking device by a divisor; an adjusting circuit arranged to adjust the divisor into an updated divisor to reduce the static phase difference between the second reference clock and the feedback clock; and a calibrating circuit arranged to calibrate the oscillating frequency of the oscillator according to the updated divisor, wherein the second reference clock is generated by varying a control signal of the oscillator.

28 Claims, 5 Drawing Sheets

CALIBRATION DEVICE FOR OSCILLATOR AND METHOD THEREOF

CROSS REFERENCE TO RELATED APPLICATIONS

This application claims the benefit of U.S. Provisional Application No. 61/608,498, which was filed on Mar. 8, 2012 and is included herein by reference.

BACKGROUND

The present invention is related to a calibration device for an oscillator and a method thereof, and more particularly to a calibration device for calibrating a characteristic curve of the oscillator and a method thereof.

Figure 1:
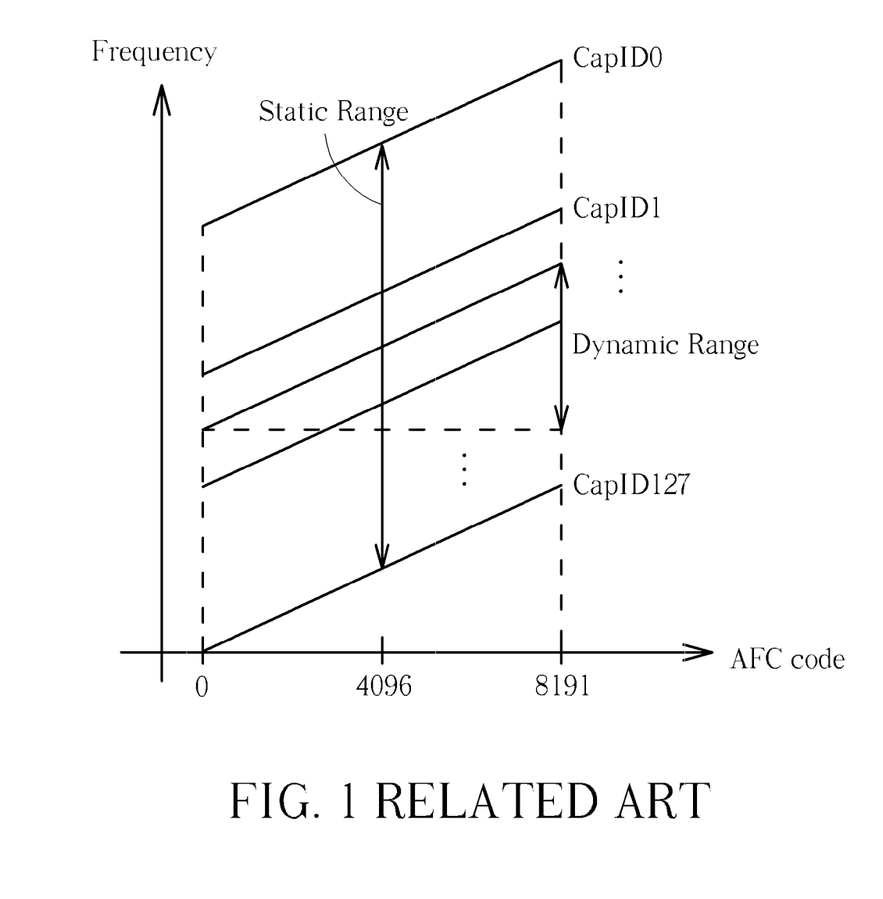
FIG. 1 is a diagram illustrating a plurality of characteristic curves of an ideal oscillator.

In a wireless communication system, an oscillator is used to generate an oscillating clock signal having a required oscillating frequency. Normally, the oscillating frequency range of an oscillator can be evaluated by two aspects: the dynamic range (DR), and the static range (SR). The ideal dynamic range and the ideal static range of an oscillator are illustrated in FIG. 1, which is a diagram illustrating a plurality of characteristic curves of an ideal oscillator. The oscillator can be controlled to generate different oscillating frequencies depending on the AFC (automatic frequency control) codes (e.g. 0~8191) and the CapID codes (e.g. 0~127). More specifically, the middle AFC code is used to determine the static range of the oscillator, and each AFC code is used to control the oscillator to generate the required oscillating frequency. Ideally, for each CapID code, the relation between the AFC code and the oscillating frequency is linear, i.e., the plurality of straight lines as shown in FIG. 1. In practice, however, the relation between the AFC code and the oscillating frequency of the oscillator is not linear, such that the line representing the transfer function between the AFC code and the oscillating frequency will be a curve instead of a straight line as shown in FIG. 1. Consequently, the wireless communication system may not have enough margins to track the temperature variation and crystal aging, and may not have enough margins for initial crystal offset and static error during the manufacturing process (e.g. the soldering process). Moreover, using the conventional off-chip instrument to test the SR and DR of an oscillator is time consuming and involves extra costs. Therefore, providing an effective and low-cost way to test and calibrate the SR and DR of an oscillator is an urgent problem in this field.

SUMMARY

One of the objectives of the present embodiment is to provide a calibration device for calibrating a characteristic curve of an oscillator and a method thereof.

According to a first embodiment, a calibration device is disclosed. The calibration device is arranged for calibrating an oscillating frequency of an oscillator. The calibration device comprises a phase locking device, an adjusting circuit, and a calibrating circuit. The phase locking device is arranged to track a first reference clock generated by the oscillator until a feedback clock is phase-aligned with the first reference clock, and then arranged to track a second reference clock generated by the oscillator until a phase difference between the second reference clock and the feedback clock is a static phase difference, wherein the feedback clock is generated by dividing an output oscillating signal of the phase locking device by a divisor, wherein a frequency of the second reference clock is different from a frequency of the first reference clock with a frequency difference. The adjusting circuit is arranged to adjust the divisor into an updated divisor to reduce the static phase difference between the second reference clock and the feedback clock. The calibrating circuit is arranged to calibrate the oscillating frequency of the oscillator according to the updated divisor corresponding to the frequency difference.

According to a second embodiment, a calibration method is disclosed. The calibration method is arranged for calibrating an oscillating frequency of an oscillator. The calibration method comprises the steps of: controlling a phase locking device to track a first reference clock generated by the oscillator until a feedback clock is phase-aligned with the first reference clock, and then to track a second reference clock generated by the oscillator until a phase difference between the second reference clock and the feedback clock is a static phase difference, wherein the feedback clock is generated by dividing an output oscillating signal of the phase locking device by a divisor, wherein a frequency of the second reference clock is different from a frequency of the first reference clock with a frequency difference; adjusting the divisor into an updated divisor to reduce the static phase difference between the second reference clock and the feedback clock; and calibrating the oscillating frequency of the oscillator according to the updated divisor corresponding to the frequency difference.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 2:
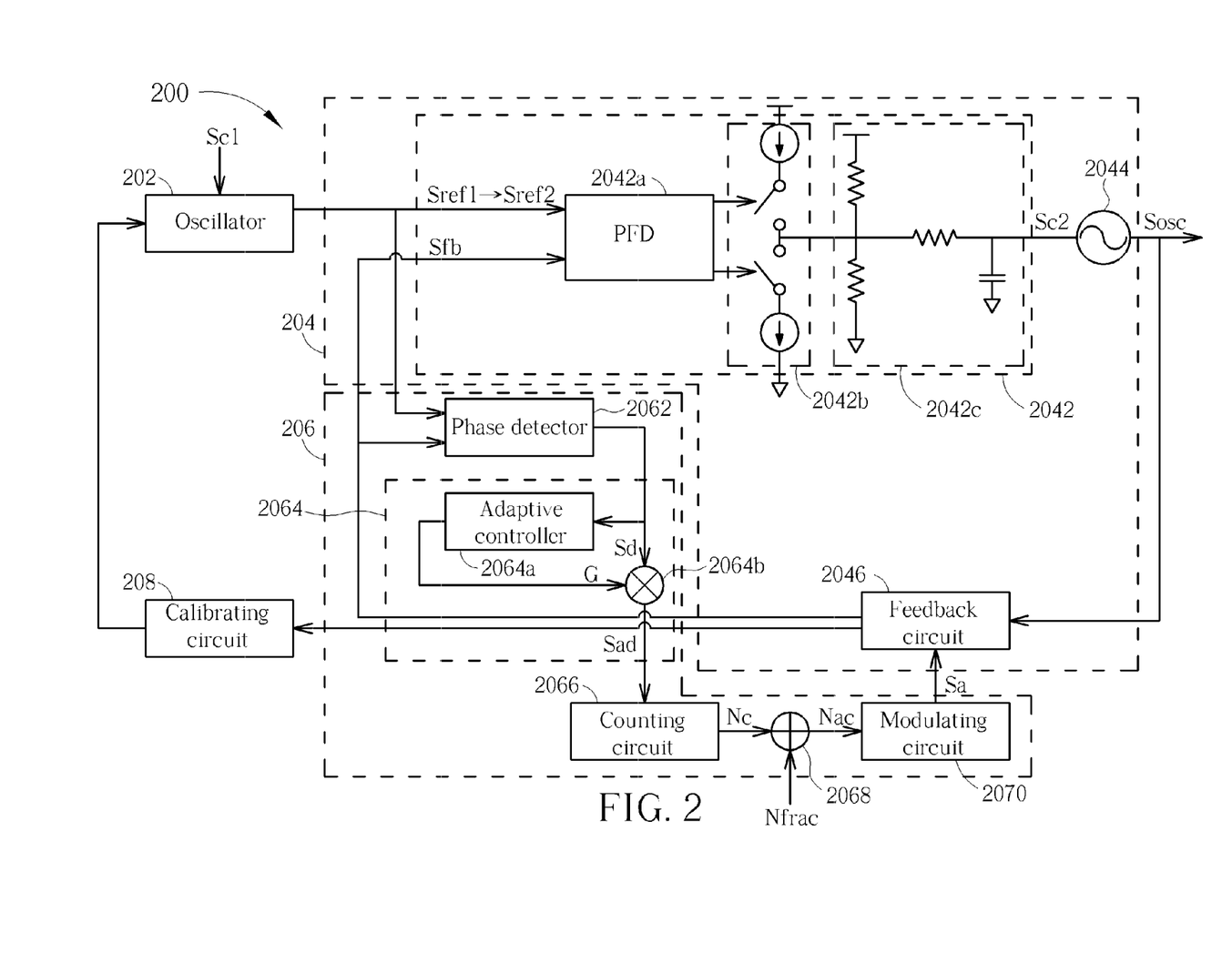
FIG. 2 is a diagram illustrating a calibration device according to a first embodiment of the present invention.

Please refer to FIG. 2, which is a diagram illustrating a calibration device 200 according to an embodiment of the present invention. The calibration device 200 is used to calibrate the oscillating frequency of an oscillator 202, in which the oscillator is also shown in FIG. 2. The oscillator 202 may be a digital-controlled crystal oscillator, or a voltage-controlled crystal oscillator, or a ceramic oscillator, or a resonator implemented by conductive and inductive components, or a relaxation oscillator. The calibration device 200 comprises a phase locking device 204, an adjusting circuit 206, and a calibrating circuit 208. It is noted that the calibration device 200 of this embodiment is implemented as analog circuit, in which the oscillator 202 is a voltage-controlled crystal oscillator, the phase locking device 204 is an analog phase-locked loop, and the adjusting circuit 206 can be implemented by an analog or digital adjusting circuit. The phase locking device 204 is arranged to track a first reference clock Sref1 generated by the oscillator 202 until a feedback clock Sfb is phase-aligned with the first reference clock Sref1, and then arranged to track a second reference clock Sref2 generated by the oscillator 202 until a phase difference between the second reference clock Sref2 and the feedback clock Sfb is a static phase difference, wherein the feedback clock Sfb is generated by dividing an output oscillating signal Sosc of the phase locking device 204 by a divisor N. The adjusting circuit 206 is arranged to adjust the divisor N into an updated divisor Nu to reduce the static phase difference between the second reference clock Sref2 and the feedback clock Sfb. The calibrating circuit 208 is arranged to calibrate the oscillating frequency of the oscillator 202 at least according to the updated divisor Nu. In addition, the second reference clock Sref2 is generated by varying a control signal Sc1 of the oscillator 202 according to a predetermined value when the oscillator 202 is generating the first reference clock Sref1.

The phase locking device 204 comprises a detecting circuit 2042, a controllable oscillator 2044, and a feedback circuit 2046. The detecting circuit 2042 is arranged to detect the phase difference between the corresponding reference clock (e.g. Sref1 or Sref2) and the feedback clock Sfb to generate a control signal Sc2. The controllable oscillator 2044 is arranged to generate the output oscillating signal Sosc according to the control signal Sc2. The feedback circuit 2046 is arranged to generate the feedback clock Sfb to the detecting circuit 2042 according to the output oscillating signal Sosc and the divisor N. The detecting circuit 2042 comprises a phase/frequency detector (PFD) 2042a, a charge pump circuit 2042b, and a loop filter 2042c, in which the arrangement of the phase/frequency detector 2042a, the charge pump circuit 2042b, and the loop filter 2042c are shown in FIG. 2.

The adjusting circuit 206 comprises a phase detector 2062, a control circuit 2064, a counting circuit 2066, a logic circuit 2068, and a modulating circuit 2070. The phase detector 2062 is arranged to detect the static phase difference to generate a detecting output Sd. The control circuit 2064 is arranged to adaptively adjust the detecting output Sd by a gain to generate an adjusted output signal Sad, in which the control circuit 2064 comprises an adaptive controller 2064a and a multiplier 2064b as shown in FIG. 2. The counting circuit 2066 is arranged to generate a counting number Nc according to the adjusted output signal Sad. The logic circuit 2068 is arranged to generate an adjusted counting number Nac according to the counting number Nc and a fractional number Nfrac. The modulating circuit 2070 is arranged to generate an adjusting signal Sa to update the divisor N as the updated divisor Nu to reduce the static phase difference between the second reference clock Sref2 and the feedback clock Sfb according to the adjusted counting number Nac. In this embodiment, the logic circuit 2068 is an adding circuit arranged to add up the counting number Nc and the fractional number Nfrac to generate the adjusted counting number Nac. Therefore, the updated divisor Nu is equivalent to the value of the summation of the divisor N, the counting number Nc, and the fractional number Nfrac, i.e. Nu=N+Nc+Nfrac.

In this embodiment, the tuning range of the oscillator 202 may be controlled by a plurality of CapID codes and a plurality of AFC codes (i.e. via the control signal Sc1), wherein the dynamic range (e.g. the sub-band frequency range) of the oscillator 202 is determined by one CapID code and the plurality of AFC codes, and the static range is determined by the middle AFC code of each sub-band. When the oscillator 202 is fabricated, and provided the relation between the AFC codes and the oscillating frequency of the oscillator 202 is not linear, the oscillator 202 needs to be calibrated to make the characteristic curve linear. According to the arrangement in FIG. 2, the fabricated oscillator 202 is arranged to generate the second reference clock Sref2 according to the AFC codes and the CapID codes. Then, the phase locking device 204 tracks the second reference clock Sref2 until the phase difference between the second reference clock Sref2 and the feedback clock Sfb is the static phase difference, and the adjusting circuit 206 then adjusts the divisor N to reduce the static phase difference. Then, the calibrating circuit 208 calibrates the oscillating frequency of the oscillator 202 according to the updated divisor Nu. More specifically, the calibration device 200 is provided to find out the characteristic curve of the oscillator 202, and the calibrating circuit 208 then calibrates the characteristic curve to make the characteristic curve be linear (see the ideal characteristic curves as shown in FIG. 1). It should be noted that the calibration/pre-distortion executed by the calibrating circuit 208 may also be accomplished by software or firmware. Moreover, in another embodiment, after the characteristic curve of the oscillator 202 are obtained, the calibrating circuit 208 may be arranged to calibrate the characteristic curve of the oscillator 202 by pre-distorting the divisor N of the feedback circuit 2046 instead of directly calibrating the oscillator 202, which also belongs to the scope of the present invention. In addition, the calibration/pre-distortion executed by the calibrating circuit 208 may be accomplished by software or firmware.

Figure 3:
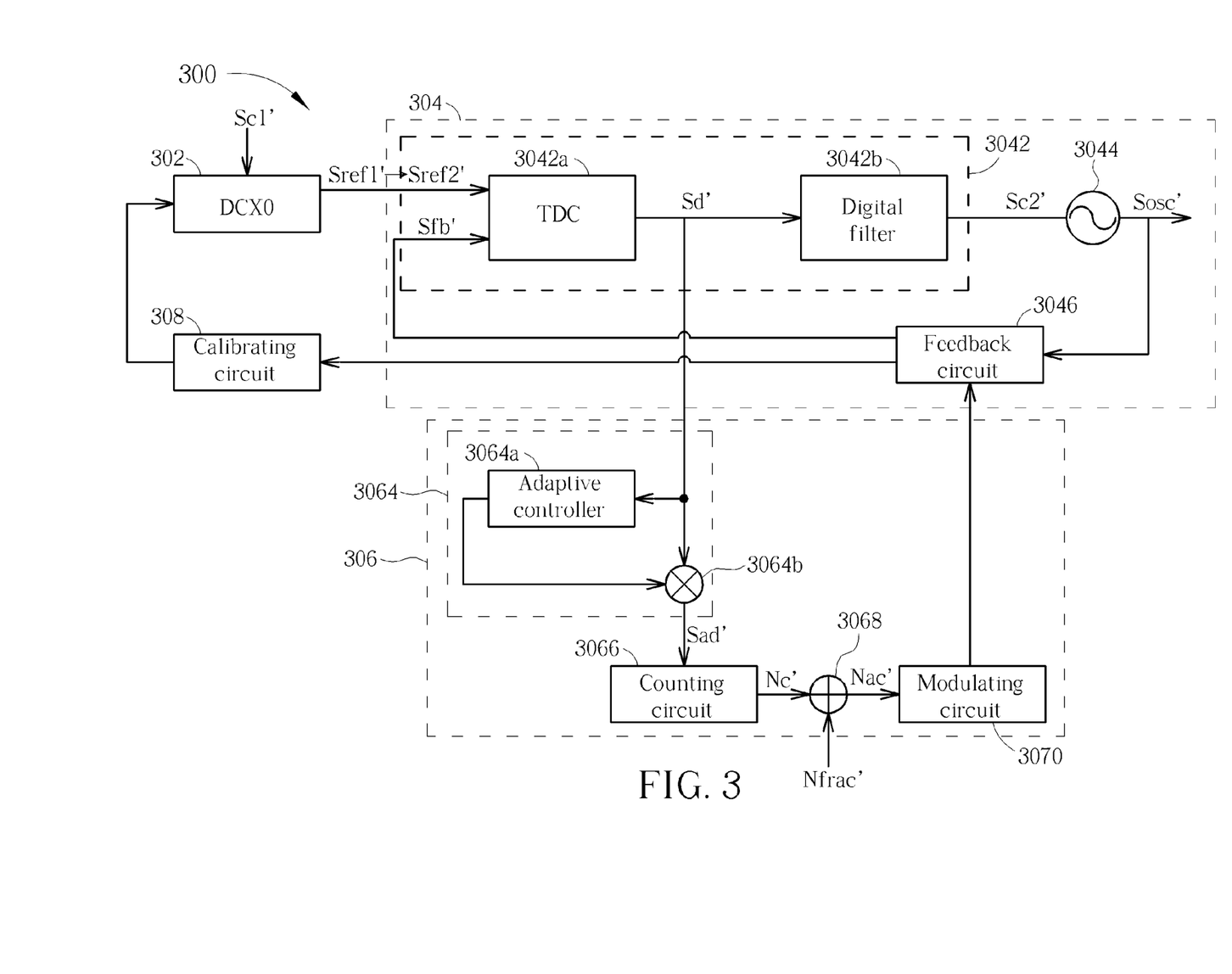
FIG. 3 is a diagram illustrating a calibration device according to a second embodiment of the present invention.

In a second embodiment, the present calibration device is an all-digital circuit as shown in FIG. 3. FIG. 3 is a diagram illustrating a calibration device 300 according to the second embodiment of the present invention. The calibration device 300 is used to calibrate the oscillating frequency of a digital-controlled crystal oscillator (DCXO) 302, in which the oscillator is also shown in FIG. 3. The calibration device 300 comprises a digital phase locking device 304, an adjusting circuit 306, and a calibrating circuit 308. The phase locking device 304 is arranged to track a first reference clock Sref1' generated by the oscillator 302 until a feedback clock Sfb' is phase-aligned with the first reference clock Sref1', and then arranged to track a second reference clock Sref2' generated by the oscillator 302' until a phase difference between the second reference clock Sref2' and the feedback clock Sfb' is a static phase difference, wherein the feedback clock Sfb' is generated by dividing an output oscillating signal Sosc' of the phase locking device 304 by a divisor N'. The adjusting circuit 306 is arranged to adjust the divisor N' into an updated divisor Nu' to reduce the static phase difference between the second reference clock Sref2' and the feedback clock Sfb'. The calibrating circuit 308 is arranged to calibrate the oscillating frequency of the oscillator 302 at least according to the updated divisor Nu'. In addition, the second reference clock Sref2' is generated by varying a control signal Sc1' of the oscillator 302 according to a predetermined value when the oscillator 302 is generating the first reference clock Sref1'.

The phase locking device 304 comprises a detecting circuit 3042, a controllable digital oscillator 3044, and a feedback circuit 3046. The detecting circuit 3042 comprises a time-to-digital converter (TDC) 3042a and a digital filter 3042b. The time-to-digital converter 3042a is arranged for converting the phase difference (i.e. time difference) between the corresponding reference clock (e.g. Sref1' or Sref2') and the feedback clock Sfb' to generate a digital phase difference Sd'. The digital filter 3042b is arranged to generate the control signal Sc2' according to the digital phase difference Sd'. The controllable digital oscillator 3044 is arranged to generate the output oscillating signal Sosc' according to the control signal Sc2'. The feedback circuit 3046 is arranged to generate the feedback clock Sfb' to the detecting circuit 3042 according to the output oscillating signal Sosc' and the divisor N'.

The adjusting circuit 306 comprises a control circuit 3064, a counting circuit 3066, a logic circuit 3068, and a modulating circuit 3070. The control circuit 3064 is arranged to adaptively adjust the digital phase difference Sd' by a gain to generate an adjusted output signal Sad', in which the control circuit 3064 comprises an adaptive controller 3064a and a multiplier 3064b as shown in FIG. 3. The counting circuit 3066 is arranged to generate a counting number Nc' according to the adjusted output signal Sad'. The logic circuit 3068 is arranged to generate an adjusted counting number Nac' according to the counting number Nc' and a fractional number Nfrac'. The modulating circuit 3070 is arranged to generate an adjusting signal Sa' to update the divisor N' as the updated divisor Nu' to reduce the static phase difference between the second reference clock Sref2' and the feedback clock Sfb' according to the adjusted counting number Nac'. In this embodiment, the logic circuit 3068 is an adding circuit arranged to add up the counting number Nc' and the fractional number Nfrac' to generate the adjusted counting number Nac'. Therefore, the updated divisor Nu' is equivalent to the value of the summation of the divisor N', the counting number Nc', and the fractional number Nfrac', i.e. Nu'=N'+Nc'+Nfrac'.

In comparison with the calibration device 200, the phase detector 2062 of the calibration device 200 is omitted in the calibration device 300 since the phase locking device 304 is an all-digital phase-locked loop. Therefore, the time-to-digital converter 3042a is co-used by the digital phase locking device 304 and the adjusting circuit 306. It is noted that the operation of the calibration device 300 is similar to the operation of the calibration device 200, therefore the detailed description of the calibration device 300 is omitted here for brevity.

Figure 4:
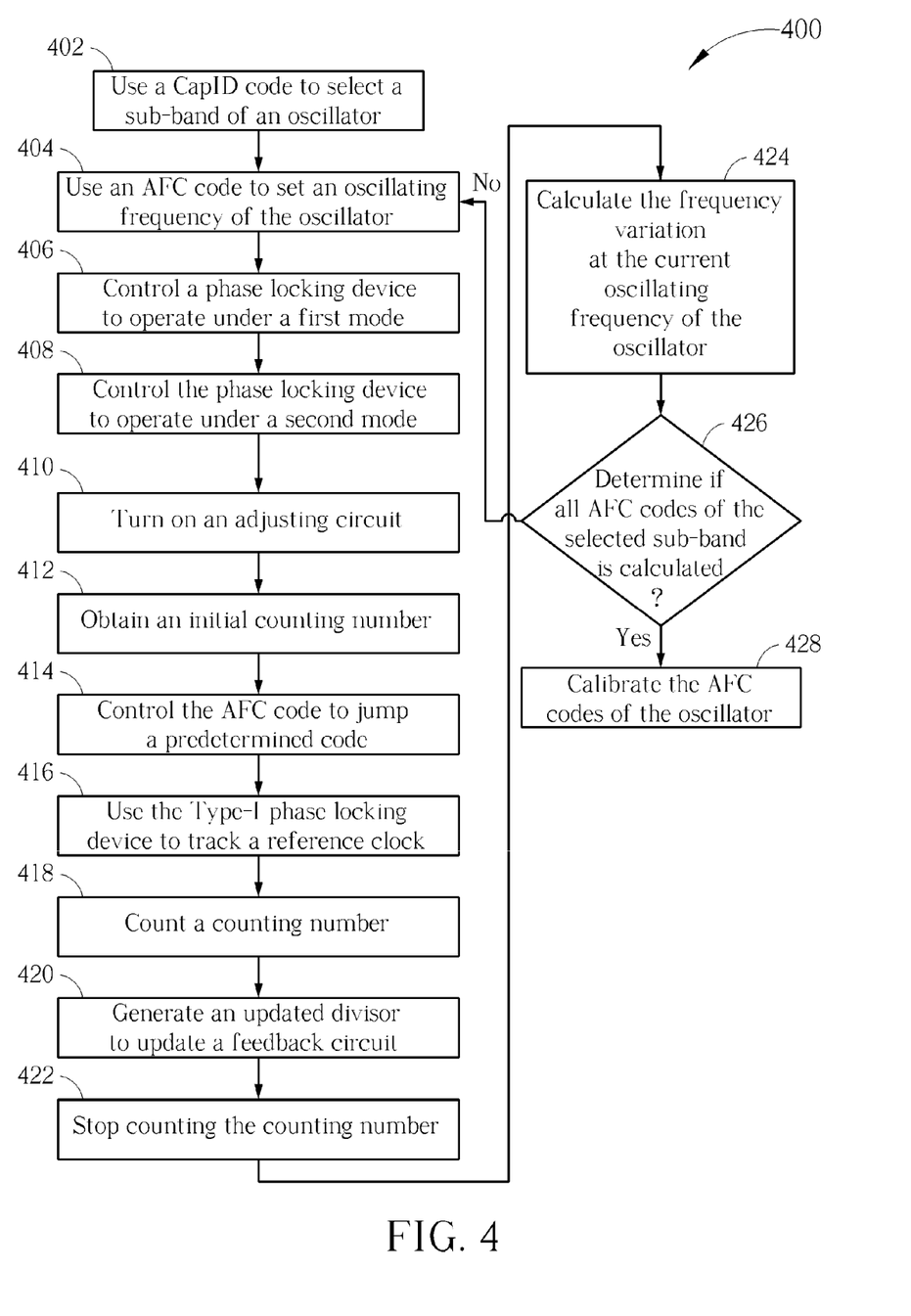
FIG. 4 is a flowchart illustrating a calibrating method executed by a calibration device according to an embodiment of the present invention.

Please refer to FIG. 4, which is a flowchart illustrating a calibrating method 400 executed by the calibration device 200 or the calibration device 300 according to an embodiment of the present invention. For brevity, the detailed operation of the calibrating method 400 is described in conjunction with the calibration device 200. Provided that substantially the same result is achieved, the steps of the flowchart shown in FIG. 4 need not be in the exact order shown and need not be contiguous; that is, other steps can be intermediate. The calibrating method 400 comprises:

Step 402: Use a CapID code to select a sub-band of the oscillator 202;

Step 404: Use an AFC code to set an oscillating frequency (i.e. the first reference clock Sref1) of the oscillator 202;

Step 406: Control the phase locking device 204 to operate under a first mode, i.e. Type-2, to track the first reference clock Sref1 generated by the oscillator 202 until a phase of the first reference clock Sref1 is aligned with a phase of the feedback clock Sfb;

Step 408: Control the phase locking device 204 to operate under a second mode, i.e. Type-1;

Step 410: Turn on the adjusting circuit 206;

Step 412: Obtain an initial counting number Ni;

Step 414: Control the AFC code to jump a predetermined value (or a predetermined code) in order to make the oscillator 202 to make the first reference clock Sref1 change to the second reference clock Sref2;

Step 416: Use the Type-I phase locking device 204 to track the second reference clock Sref until the phase difference between the second reference clock Sref2 and the feedback clock Sfb is the static phase difference;

Step 418: Count the counting number Nc according to the static phase difference between the second reference clock Sref2 and the feedback clock Sfb;

Step 420: Generate the updated divisor Nu to update the divisor N of the feedback circuit 2046 to reduce the phase difference between the second reference clock Sref2 and the feedback clock Sfb according to the counting number Nc and the fractional number Nfrac;

Step 422: Stop counting the counting number Nc when the phase difference between the second reference clock Sref2 and the feedback clock Sfb substantially equals zero;

Step 424: Calculate the frequency variation at the current oscillating frequency of the oscillator 202 in the unit of parts per million (ppm) according to the divisor N, the counting number Nc, and the fractional number Nfrac, i.e. the updated divisor Nu;

Step 426: Determine if all AFC codes of the selected sub-band are calculated; if no, go to step 404, if yes, go to step 428;

Step 428: Calibrate the AFC codes of the oscillator 202 to make the characteristic curve corresponding to the CapID code linear.

According to the FIG. 4, the calibrating method 400 is used to calibrate the characteristic curve corresponding to one CapID code of the oscillator 202, but this is not a limitation of the present invention. The calibrating method 400 can also be used to calibrate all of the characteristic curves of the oscillator 202 when the system is required. In step 402, a CapID code is inputted to the oscillator 202 to select a required sub-band of the oscillator 202, in which the CapID code may control the capacitor arrays in the oscillator 202 to select the required sub-band. Moreover, for the oscillator 202, the plurality of AFC codes are used to define the dynamic range corresponding to the selected sub-band of oscillator 202. To calibrate the characteristic curve corresponding to the CapID code, each AFC code of the oscillator 202 may be calibrated. Therefore, in step 404, an AFC code (i.e. the control signal Sc1) is inputted to the oscillator 202 to set an oscillating frequency of the oscillator 202. It is noted that, in step 404, the AFC code may start from the minimum AFC code to the maximum AFC code, or from the maximum AFC code to the minimum AFC code, or any other order to select the AFC code.

When a CapID code and a first AFC code are inputted to the oscillator 202, the oscillator 202 generates the first reference clock Sref1 corresponding to the CapID code and the first AFC code. In step 406, the phase locking device 204 is controlled to operate under a first mode, i.e. Type-2, to track the first reference clock Sref1 generated by the oscillator 202 until a phase of the first reference clock Sref1 is aligned with a phase of the feedback clock Sfb. It should be noted that, when the phase locking device 204 operates under Type-2 and when the first reference clock Sref1 is aligned with a phase of the feedback clock Sfb, there will be no detecting signal outputted from the phase/frequency detector 2042a since the impulse width of the detecting signal is substantially equal to zero when the first reference clock Sref1 is aligned with a phase of the feedback clock Sfb.

In step 408, the phase locking device 204 is controlled to operate under the second mode, i.e. Type-1. It should be noted that, when the phase locking device 204 operates under Type-1, the phase locking device 204 can only lock the oscillating frequency of the feedback clock Sfb to equal the oscillating frequency of the second reference clock Sref2 rather than lock the phase of the second reference clock Sref2 to equal the phase of the feedback clock Sfb. In other words, the phase of the second reference clock Sref2 may not align with the phase of the feedback clock Sfb when the Type-1 phase locking device 204 is stable. It is noted that, when the phase locking device 204 is controlled to operate under the first mode, the phase locking device 204 works as a Type-2 phase-locked loop, and when the phase locking device 204 is controlled to operate under the second mode, the phase locking device 204 works as a Type-1 phase-locked loop.

In addition, it should be noted that, even though the phase of the feedback clock Sfb has been locked to align with the phase of the first reference clock Sref1 when the phase locking device 204 operates under Type-2, there may be phase noise induced between the phase of the feedback clock Sfb and the phase of the first reference clock Sref1 when the phase locking device 204 is turned into Type-1 from Type-2. Therefore, when the adjusting circuit 206 is turned on in step 410, the counting circuit 2066 is first arranged to count an initial counting number Ni according to the phase difference between the first reference clock Sref1 and the feedback clock Sfb, wherein the phase difference may be caused by the phase noise of the first reference clock Sref1 and the feedback clock Sfb. Meanwhile, the modulating circuit 2070 generates the adjusting signal Sa to adjust the divisor N for reducing the phase difference according to the counting number Nc and a fractional number Nfrac. The modulating circuit 2070 may be a sigma-delta modulator.

It is noted that, in the adjusting circuit 206, a bang-bang phase/frequency detector (i.e. the phase detector 2062) is used to detect the phase difference between the first reference clock Sref1 and the feedback clock Sfb. Therefore, the detecting output Sd of the phase detector 2062 is either +1 or −1, wherein the detecting output Sd of +1 represents the phase of the first reference clock Sref1 leads the phase of the feedback clock Sfb, and the detecting output Sd of −1 represents the phase of the first reference clock Sref1 lags the phase of the feedback clock Sfb, or vice versa. After a few times of adjusting the divisor N, if the detecting output Sd of the phase detector 2062 is a series of alternate +1 and −1 values, then the Type-1 phase locking device 204 is stable.

In step 414, the AFC code is controlled to jump the predetermined code to make the first reference clock Sref1 of the oscillator 202 change to the second reference clock Sref2. Accordingly, the phase of the second reference clock Sref2 and the phase of the feedback clock Sfb will be deviated. Then, in step 416, the Type-I phase locking device 204 is arranged to track the second reference clock Sref2 until the phase difference between the second reference clock Sref2 and the feedback clock Sfb becomes a static phase difference. When the phase difference between the second reference clock Sref2 and the feedback clock Sfb is the static phase difference, the phase detector 2062 detects the phase difference between the second reference clock Sref2 and the feedback clock Sfb and outputs the detecting output Sd of either +1 or −1. It is noted that the static phase difference depends on a frequency range between the oscillating frequency of the first reference clock Sref1 and the oscillating frequency of the second reference clock Sref2, and the static phase difference is a fixed phase difference between the second reference clock Sref2 and the feedback clock Sfb before the adjusting circuit 206 adjusts the divisor N of the feedback circuit 2046 during the second mode.

Similarly, the detecting output Sd of +1 represents the phase of the second reference clock Sref2 leads the phase of the feedback clock Sfb, and the detecting output Sd of −1 represents the phase of the second reference clock Sref2 lags the phase of the feedback clock Sfb, or vice versa. Meanwhile, the counting circuit 2066, which is an up-down counter, counts the detecting output Sd to generate the counting number Nc. The modulating circuit 2070, which is a sigma-delta modulator, modulates the summation (i.e. the adjusted counting number Nac) of the counting number Nc and the fractional number Nfrac to generate the adjusting signal Sa to update the divisor N as the updated divisor Nu for reducing the static phase difference between the second reference clock Sref2 and the feedback clock Sfb. Similarly, after a few times of adjusting the divisor N, if the detecting output Sd of the phase detector 2062 is a series of alternate +1 and −1 values, then the Type-1 phase locking device 204 is stable.

When the Type-1 phase locking device 204 is stable, this means that the phase difference between the second reference clock Sref2 and the feedback clock Sfb substantially equals zero, and the counting circuit 2066 will stop counting the detecting output Sd of the phase detector 2062 in step 422. Also, it should be noted that when the phase difference between the second reference clock Sref2 and the feedback clock Sfb substantially equals zero, the current oscillating frequency (fvco') of the controllable oscillator 2044 is equal to the oscillating frequency (fvco) of the controllable oscillator 2044 before the feedback circuit 2046 is adjusted, i.e. the oscillating frequency of the controllable oscillator 2044 at the step 416. Accordingly, in step 424, the frequency variation Δf (i.e. the frequency difference between the current oscillating frequency fref' and the oscillating frequency fref before the AFC code is jumped) at the current oscillating frequency fref' of the oscillator 202 in the unit of parts per million (ppm) can be obtained by the following equation (1):

$$\begin{aligned} fvco &= (N + Nfrac) * fref \\ &= fvco' \\ &= (N + Nfrac + Nc) * fref' \\ =>\Delta F \\ &= \left(\frac{fref' - fref}{fref}\right) * 10^6 \\ &= \left(\frac{-Nc}{N + Nfrac + Nc}\right) * 10^6 \end{aligned} \quad (1)$$

wherein fref represents the oscillating frequency of the oscillator 202 before the AFC code is jumped, i.e. the oscillating frequency of the oscillator 202 at step 408. It should be noted that the counting number Nc obtained in step 422 may also need to be calibrated by the initial counting number Ni obtained in step 412 in order to cancel the phase noise effects when the phase locking device 204 is turned into Type-1 from Type-2.

In step 426, if all the frequency variations of the AFC codes of the selected sub-band are calculated, then the characteristic curve corresponding to the CapID code can be obtained. In step 428, the AFC codes of the oscillator 202 can be calibrated or pre-distorted by appropriate codes to make the characteristic curve corresponding to the CapID code linear. In step 426, if there are still AFC codes of the selected sub-band which have not been calculated, then the calibration device 200 will go to step 404 to continue to input the remaining AFC codes to the oscillator 202 until all the frequency variations of the AFC codes of the selected sub-band have been calculated.

Figure 5:
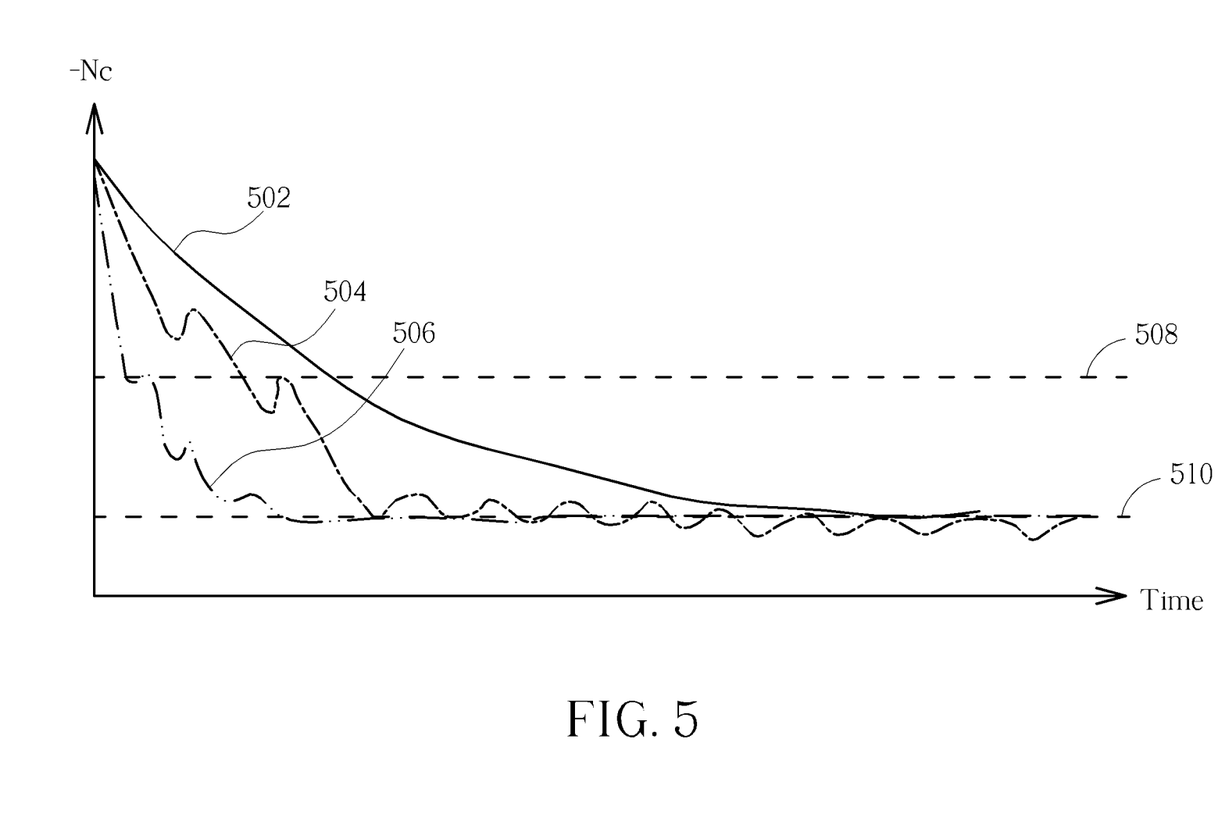
FIG. 5 is a timing diagram illustrating a counting number corresponding to different gains according to an embodiment of the present invention.

Please refer to FIG. 2 again. To speed-up the settling of the phase locking device 204 in the steps 418-422, the adaptive controller 2064a is utilized to adaptively provide a gain G according to the detecting output Sd. The multiplier 2064b is used to multiply the detecting output Sd by the gain G to generate the adjusted output signal Sad for the counting circuit 2066. More specifically, to speed-up the settling of the phase locking device 204 in the steps 418-422, the adaptive controller 2064a first sets the gain G as the maximum gain when the phase detector 2062 starts to detect the phase difference between the second reference clock Sref2 and the feedback clock Sfb in step 418. The multiplier 2064b uses the maximum gain to multiply the detecting output Sd for generating the adjusted output signal Sad. Accordingly, the counting number Nc generated by the counting circuit 2066 is amplified to a larger counting number when the phase detector 2062 starts to detect the phase difference in step 418. If the amplified counting number crosses a first predetermined counting number boundary 508 (see the curves 506 and 508 in FIG. 5), the adaptive controller 2064a may decrease the gain G used for multiplying the detecting output Sd in order to reduce the ripple of the counting number Nc. The adjusting circuit 206 can speed-up the settling of the phase locking device 204 in the steps 418-422. By using the above method, when the phase of the feedback clock Sfb is close to the phase of the reference clock Sref, the adaptive controller 2064a may decrease the gain G to less than a value (e.g. 1) in order to mitigate the ripple of the counting number Nc when the phase different between the feedback clock Sfb and the second reference clock Sref2 substantially equals zero as shown in FIG. 5. In other words, the adaptive controller 2064a may use a second predetermined counting number boundary 510 (see the curves 506 and 510 in FIG. 5) to determine if the gain G can be set to less than 1. If the amplified counting number crosses the second predetermined counting number boundary, the adaptive controller 2064a may decrease the gain G to less than 1 for multiplying the detecting output Sd in order to reduce the ripple of the counting number Nc when the phase difference between the feedback clock Sfb and the second reference clock Sref2 substantially equals zero.

FIG. 5 is a timing diagram illustrating the counting number Nc corresponding to different gains according to an embodiment of the present invention, wherein the curve 502 is the counting number Nc generated by using a fixed high gain to multiply the detecting output Sd, the curve 504 is the counting number Nc generated by using a fixed low gain to multiply the detecting output Sd, and the curve 504 is the counting number Nc generated by using an adaptive gain controlled by the adaptive controller 2064a to multiply the detecting output Sd. It can be seen that, when the fixed low gain is used to multiply the detecting output Sd, the counting number Nc (i.e. the curve 502) can be settled in a smooth way; however, the elapsed time used to settle the counting number Nc is too long. When the fixed high gain is used to multiply the detecting output Sd, the counting number Nc (i.e. the curve 504) can be settled faster; nevertheless, the ripple still remains after the counting number Nc is settled. In this embodiment, when the adaptive gain is used to multiply the detecting output Sd, the counting number Nc (i.e. the curve 506) can be settled much faster, and the ripple problem can be removed after the counting number Nc is settled. The resolution of the frequency variation $\Delta f$ of the oscillator 202 will increase. It should be noted that the actual resolution of the frequency variation $\Delta f$ may also depend on the order of the sigma-delta modulator (i.e. modulating circuit 2070), the fractional number Nfrac, the loop bandwidth, the calibration time, and the calibration algorithm. Furthermore, the order of the modulating circuit 2070 and the fractional number Nfrac also determine the gain and the dead zone of the bang-bang phase/frequency detector (i.e. the phase detector 2062), and therefore impact the detection accuracy of the phase detector 2062. To avoid the dead-zone problem and to extend the detection range of the phase detector 2062, a higher order sigma-delta modulator and a smaller fractional number is required.

Briefly, by using the calibrating method 400, an effective and accurate way to obtain the characteristic curve of the oscillator 202 is provided. AFC codes of the oscillator 202 can be calibrated or pre-distorted by appropriate codes to make the characteristic curve corresponding to the CapID code be linear (see the ideal characteristic curves as shown in FIG. 1).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A calibration device, for calibrating an oscillating frequency of an oscillator, the calibration device comprising:
  a phase locking device, arranged to track a first reference clock generated by the oscillator until a feedback clock is phase-aligned with the first reference clock, and then arranged to track a second reference clock generated by the oscillator until a phase difference between the second reference clock and the feedback clock is a static phase difference, wherein the feedback clock is generated by dividing an output oscillating signal of the phase locking device by a divisor, wherein a frequency of the second reference clock is different from a frequency of the first reference clock with a frequency difference;
  an adjusting circuit, arranged to adjust the divisor into an updated divisor to reduce the static phase difference between the second reference clock and the feedback clock; and
  a calibrating circuit, arranged to calibrate the oscillating frequency of the oscillator according to the updated divisor corresponding to the frequency difference.

2. The calibration device of claim 1, wherein the adjusting circuit keeps adjusting the static phase difference between the second reference clock and the feedback clock until the static phase difference substantially equals zero.

3. The calibration device of claim 1, wherein the phase locking device comprises:
  a detecting circuit, arranged to detect the phase difference between the corresponding reference clock and the feedback clock to generate a first control signal;
  a controllable oscillator, arranged to generate the output oscillating signal according to the first control signal; and
  a feedback circuit, arranged to generate the feedback clock to the detecting circuit according to the output oscillating signal and the divisor.

4. The calibration device of claim 1, wherein when the phase locking device is controlled to operate under a first mode, the phase locking device tracks the first reference clock until a phase of the reference clock is aligned with a phase of the feedback clock; and when the phase locking device is controlled to switch from the first mode to a second mode, the first reference clock changes to the second reference clock, and the phase locking device tracks the second reference clock until the phase difference between the second reference clock and the feedback clock is the static phase difference.

5. The calibration device of claim 4, wherein when the phase locking device is controlled to operate under the first mode, the phase locking device works as a Type-2 phase-locked loop, and when the phase locking device is controlled to operate under the second mode, the phase locking device works as a Type-1 phase-locked loop.

6. The calibration device of claim 4, wherein the static phase difference depends on a frequency range between the frequency of the first reference clock and the frequency of the second reference clock, and the static phase difference is a fixed phase difference between the second reference clock and the feedback clock before the adjusting circuit starts to adjust the divisor of the feedback circuit during the second mode.

7. The calibration device of claim 1, wherein the adjusting circuit comprises:
   a phase detector, arranged to detect the static phase difference to generate a detecting output;
   a counting circuit, arranged to generate a counting number according to the detecting output; and
   a modulating circuit, arranged to generate an adjusting signal to adjust the divisor into the updated divisor to reduce the static phase difference between the second reference clock and the feedback clock according to the counting number.

8. The calibration device of claim 7, wherein the phase detector is a bang-bang detector.

9. The calibration device of claim 7, wherein the adjusting circuit further comprises:
   a control circuit, arranged to adjust the detecting output by a gain to generate an adjusted output signal, wherein the counting circuit is an up-down counter arranged to generate the counting number according to the adjusted output signal.

10. The calibration device of claim 9, wherein the control circuit adaptively adjusts the gain according to the counting number.

11. The calibration device of claim 9, wherein when the counting number crosses a predetermined counting number boundary, the control circuit decreases the gain imposed on the detecting output.

12. The calibration device of claim 1, wherein the adjusting circuit comprises:
   a counting circuit, arranged to generate a counting number according to the static phase difference; and
   a modulating circuit, arranged to generate an adjusting signal to adjust the divisor into the updated divisor to reduce the static phase difference between the second reference clock and the feedback clock according to the counting number.

13. The calibration device of claim 12, wherein the adjusting circuit further comprises:
   a control circuit, arranged to adjust the static phase difference by a gain to generate an adjusted output signal, wherein the counting circuit is an up-down counter arranged to generate the counting number according to the adjusted output signal.

14. The calibration device of claim 13, wherein the control circuit adaptively adjusts the gain according to the counting number.

15. The calibration device of claim 13, wherein when the counting number crosses a predetermined counting number boundary, the control circuit decreases the gain imposed on the static phase difference.

16. A calibration method, for calibrating an oscillating frequency of an oscillator, the calibration method comprising:
   controlling a phase locking device to track a first reference clock generated by the oscillator until a feedback clock is phase-aligned with the first reference clock, and then to track a second reference clock generated by the oscillator until a phase difference between the second reference clock and the feedback clock is a static phase difference, wherein the feedback clock is generated by dividing an output oscillating signal of the phase locking device by a divisor, wherein a frequency of the second reference clock is different from a frequency of the first reference clock with a frequency difference;
   adjusting the divisor into an updated divisor to reduce the static phase difference between the second reference clock and the feedback clock; and
   calibrating the oscillating frequency of the oscillator according to the updated divisor corresponding to the frequency difference.

17. The calibration method of claim 16, wherein the step of adjusting the divisor into the updated divisor to reduce the static phase difference between the second reference clock and the feedback clock comprises:
   continuing to adjust the static phase difference between the second reference clock and the feedback clock until the static phase difference substantially equals zero.

18. The calibration method of claim 16, wherein when the phase locking device is controlled to operate under a first mode, the calibration method further comprises:
   controlling the phase locking device to track the first reference clock until a phase of the first reference clock is aligned with a phase of the feedback clock; and
   when the phase locking device is controlled to switch from the first mode to a second mode, the calibration method further comprises:
   changing the first reference clock to the second reference clock.

19. The calibration method of claim 18, wherein when the phase locking device is controlled to operate under the first mode, the phase locking device works as a Type-2 phase-locked loop, and when the phase locking device is controlled to operate under the second mode, the phase locking device works as a Type-1 phase-locked loop.

20. The calibration method of claim 18, wherein the static phase difference depends on a frequency range between the frequency of the first reference clock and the frequency of the second reference clock, and the static phase difference is a fixed phase difference between the second reference clock and the feedback clock before the starting of adjusting the divisor during the second mode.

21. The calibration method of claim 16, wherein the step of adjusting the divisor into the updated divisor to reduce the static phase difference between the second reference clock and the feedback clock comprises:
   detecting the static phase difference to generate a detecting output;
   generating a counting number according to the detecting output; and
   generating an adjusting signal to adjust the divisor into the updated divisor to reduce the static phase difference between the second reference clock and the feedback clock according to the counting number.

22. The calibration method of claim 21, wherein the step of adjusting the divisor into the updated divisor to reduce the static phase difference between the second reference clock and the feedback clock further comprises:

adjusting the detecting output by a gain to generate an adjusted output signal; and wherein the step of generating the counting number according to the detecting output comprises:

generating the counting number according to the adjusted output signal.

23. The calibration method of claim 22, wherein the step of adjusting the detecting output by the gain to generate the adjusted output signal further comprises:

adaptively adjusting the gain according to the counting number.

24. The calibration method of claim 22, wherein when the counting number crosses a predetermined counting number boundary, the gain imposed on the detecting output will be decreased.

25. The calibration method of claim 16, wherein the step of adjusting the divisor into the updated divisor to reduce the static phase difference between the second reference clock and the feedback clock comprises:

generating a counting number according to the static phase difference; and generating an adjusting signal to adjust the divisor into the updated divisor to reduce the static phase difference between the second reference clock and the feedback clock according to the counting number.

26. The calibration method of claim 25, wherein the step of adjusting the divisor into the updated divisor to reduce the static phase difference between the second reference clock and the feedback clock further comprises:

adjusting the static phase difference by a gain to generate an adjusted output signal; and wherein the step of generating the counting number according to the static phase difference comprises:

generating the counting number according to the adjusted output signal.

27. The calibration method of claim 26, wherein the step of adjusting the static phase difference by the gain to generate the adjusted output signal further comprises:

adaptively adjusting the gain according to the counting number.

28. The calibration method of claim 26, wherein when the counting number crosses a predetermined counting number boundary, the gain imposed on the static phase difference will be decreased.

* * * * *